(12) United States Patent
Hillers

(10) Patent No.: US 8,683,765 B2
(45) Date of Patent: Apr. 1, 2014

(54) WALL STRUCTURE FOR A BUILDING

(75) Inventor: Guillaume Eugène Hillers, Uznach (CH)

(73) Assignee: Stone Treuhand AG (CH)

( * ) Notice: Subject to any disclaimer, the term of this patent is extended or adjusted under 35 U.S.C. 154(b) by 0 days.

(21) Appl. No.: 13/382,382

(22) PCT Filed: Jul. 17, 2009

(86) PCT No.: PCT/CH2009/000257
§ 371 (c)(1),
(2), (4) Date: Apr. 16, 2012

(87) PCT Pub. No.: WO2011/006266
PCT Pub. Date: Jan. 20, 2011

(65) Prior Publication Data
US 2012/0192516 A1    Aug. 2, 2012

(51) Int. Cl.
*E04C 1/00* (2006.01)

(52) U.S. Cl.
USPC .............. 52/309.4; 52/309.11; 52/309.12; 52/309.16; 52/315; 52/794.1; 52/481.1; 52/443; 52/506.05; 52/507

(58) Field of Classification Search
USPC ............ 52/309.1, 309.14, 309.11, 309.12, 52/309.4, 745.09, 410, 483.1, 506.05, 507, 52/509, 481, 220.1, 443, 565, 306.16, 52/309.17, 315, 426, 794.1, 745.19
See application file for complete search history.

(56) References Cited

U.S. PATENT DOCUMENTS

| | | | | |
|---|---|---|---|---|
| 4,069,629 A | * | 1/1978 | Piazza | 52/125.5 |
| 4,125,981 A | * | 11/1978 | MacLeod et al. | 52/309.12 |
| 4,545,167 A | * | 10/1985 | Brock | 52/509 |
| 4,611,450 A | * | 9/1986 | Chen | 52/309.4 |
| 4,624,089 A | * | 11/1986 | Dunker | 52/410 |
| 4,694,624 A | * | 9/1987 | Juhas | 52/223.7 |
| 4,762,453 A | * | 8/1988 | DeCaro | 411/383 |
| 4,819,401 A | * | 4/1989 | Whitney, Jr. | 52/713 |
| 4,837,988 A | * | 6/1989 | Menchetti et al. | 52/36.4 |
| 4,852,316 A | * | 8/1989 | Webb | 52/235 |
| 4,943,336 A | * | 7/1990 | Csont | 156/280 |
| 5,048,254 A | * | 9/1991 | Merlau | 52/483.1 |
| 5,129,203 A | * | 7/1992 | Romero | 52/309.11 |

(Continued)

FOREIGN PATENT DOCUMENTS

DE    202004012893 U1    12/2005
EP          0191144          8/1986

(Continued)

OTHER PUBLICATIONS

International Search Report dated Mar. 4, 2012, issued in corresponding international application No. PCT/CH2009/000257.

*Primary Examiner* — Chi Q Nguyen
(74) *Attorney, Agent, or Firm* — Ostrolenk Faber LLP

(57) ABSTRACT

The present disclosure relates to a wall structure of a building, including a first plate-shaped support body made of a solid foam material, the surface of which to be directed toward the inside of the building adjoins an insulation layer, a first wave-like metal wire grille, which is foamed at least partially into a surface of the first support body to be directed toward the outside of the building, and first fastening elements, which penetrate both the first metal wire grille and the first support body in order to fasten support elements, between which the insulation layer is accommodated.

34 Claims, 8 Drawing Sheets

(56) References Cited

U.S. PATENT DOCUMENTS

| | | | |
|---|---|---|---|
| 5,491,945 A | | 2/1996 | Meirick |
| 5,493,837 A | * | 2/1996 | Hepler .................. 52/745.09 |
| 5,596,853 A | * | 1/1997 | Blaney et al. ............. 52/223.7 |
| 5,647,180 A | * | 7/1997 | Billings et al. ............... 52/268 |
| 5,657,602 A | * | 8/1997 | Hellander .................. 52/446 |
| 5,924,256 A | * | 7/1999 | Ito ............................. 52/481.1 |
| 5,987,837 A | * | 11/1999 | Nelson .................. 52/506.05 |
| 6,233,891 B1 | * | 5/2001 | De Cosse .................. 52/309.12 |
| 6,272,805 B1 | * | 8/2001 | Ritter et al. ............. 52/309.11 |
| 6,282,853 B1 | * | 9/2001 | Blaney et al. ............. 52/223.7 |
| 6,564,514 B1 | * | 5/2003 | Rickards .................... 52/139 |
| 6,701,683 B2 | * | 3/2004 | Messenger et al. ........ 52/309.11 |
| 6,718,712 B1 | * | 4/2004 | Heath .................... 52/309.12 |
| 6,729,090 B2 | * | 5/2004 | Messenger et al. ........ 52/309.12 |
| 6,898,908 B2 | * | 5/2005 | Messenger et al. ............ 52/268 |
| RE39,091 E | * | 5/2006 | Kuelker .................. 52/506.05 |
| 7,625,827 B2 | * | 12/2009 | Egan et al. .................. 442/20 |
| 7,788,860 B2 | * | 9/2010 | Bartman et al. .............. 52/139 |
| 8,316,597 B2 | * | 11/2012 | Goldberg et al. ............ 52/209 |
| 8,555,584 B2 | * | 10/2013 | Ciuperca .................. 52/309.7 |

FOREIGN PATENT DOCUMENTS

| | | |
|---|---|---|
| EP | 0191144 A2 | 8/1986 |
| JP | 02049843 | 2/1990 |
| JP | 10072897 | 3/1998 |
| JP | 3055868 | 11/1998 |
| JP | 2003079044 | 3/2003 |
| JP | 2005314965 | 11/2005 |
| JP | 2008156874 | 7/2008 |
| WO | WO 2005/121469 A1 | 12/2005 |
| WO | WO2005121469 | 12/2005 |
| WO | WO 2006/040623 A1 | 4/2006 |

* cited by examiner

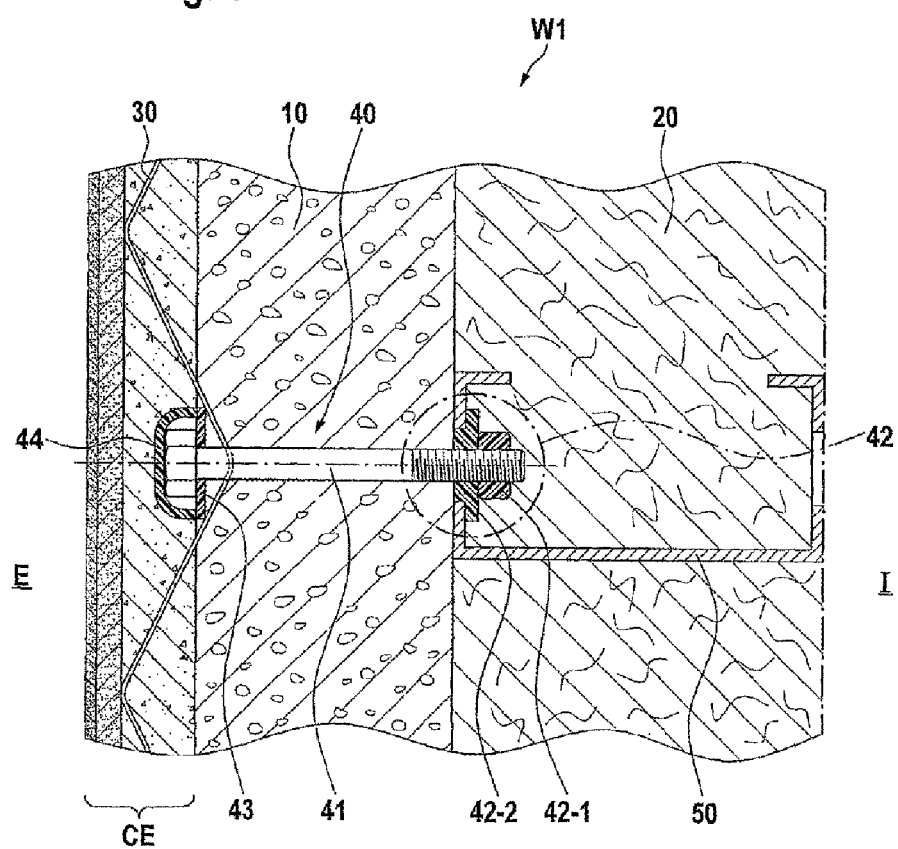

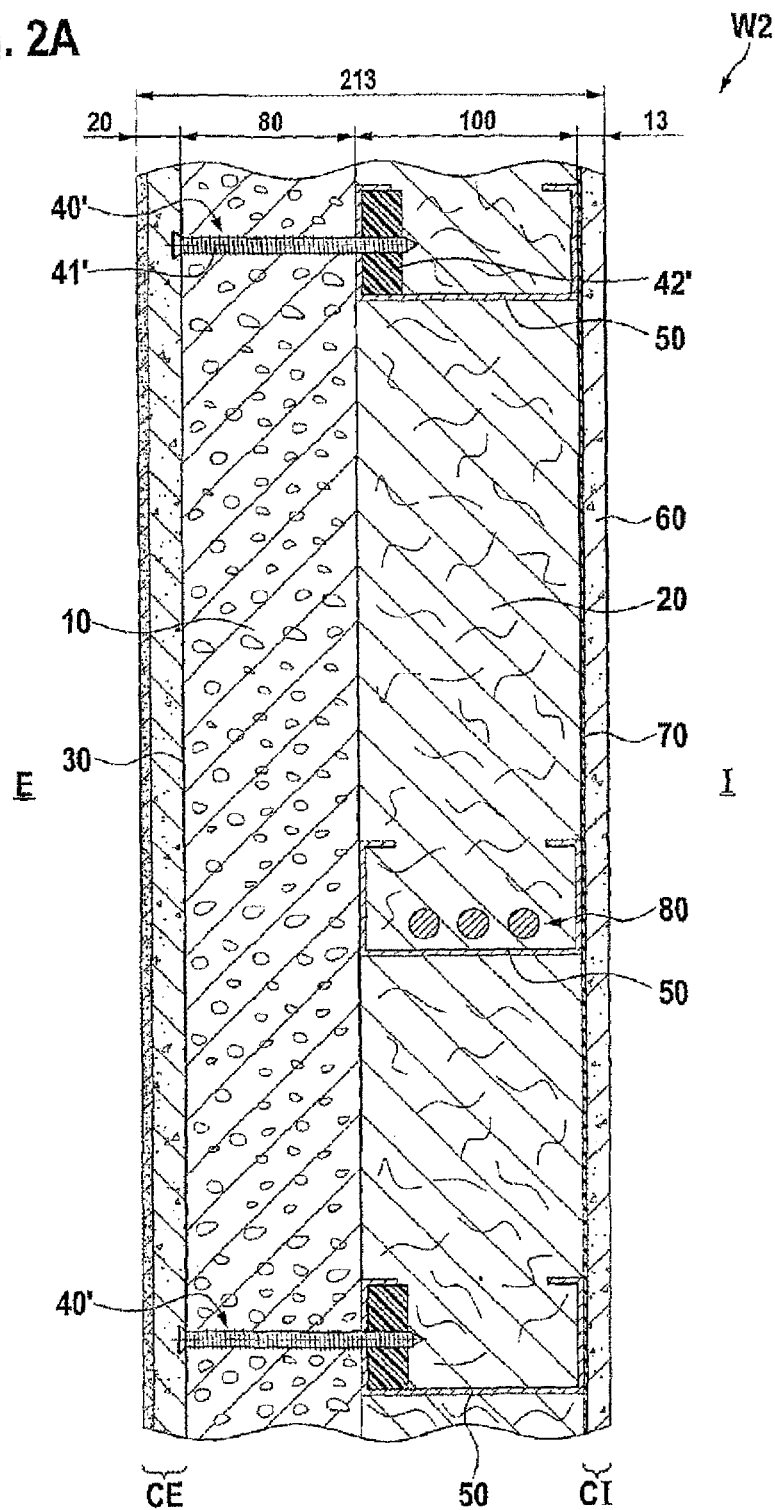

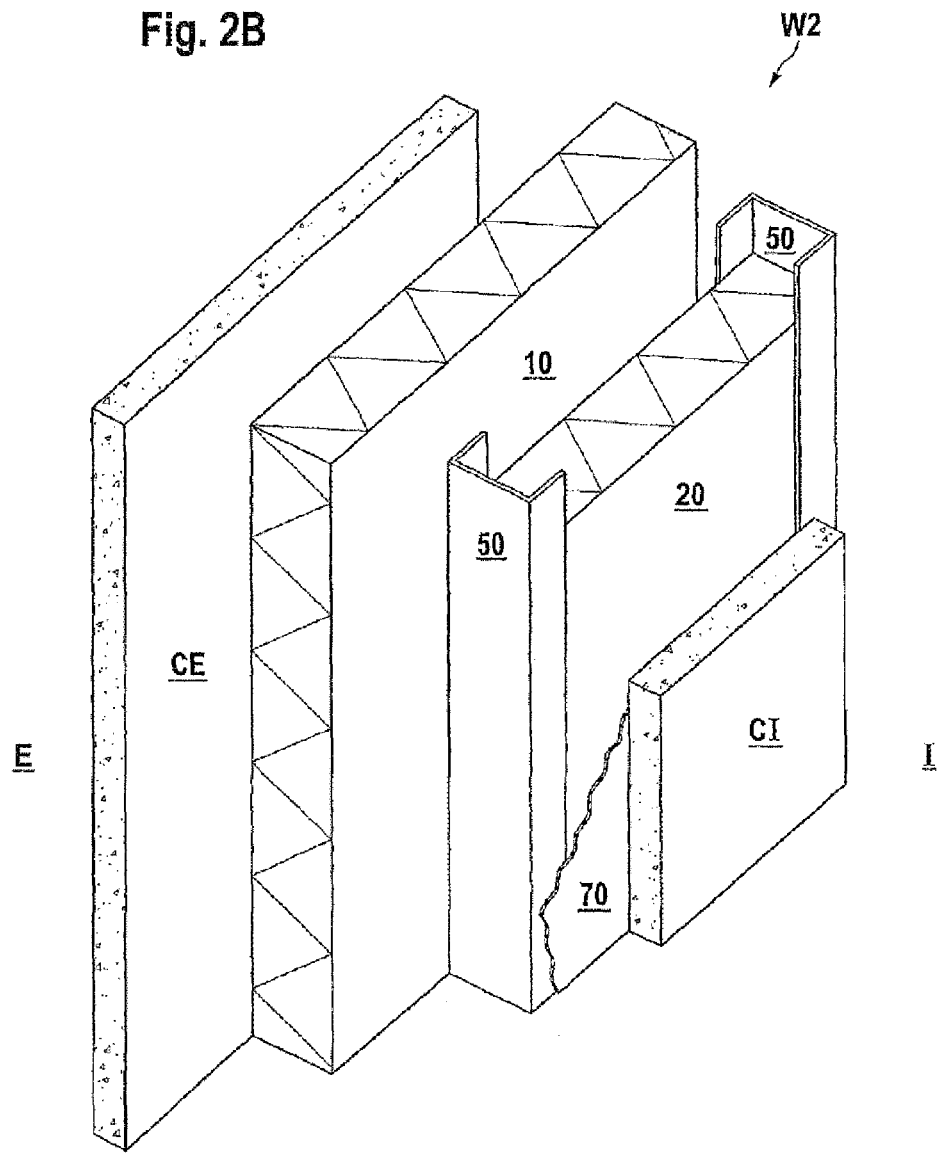

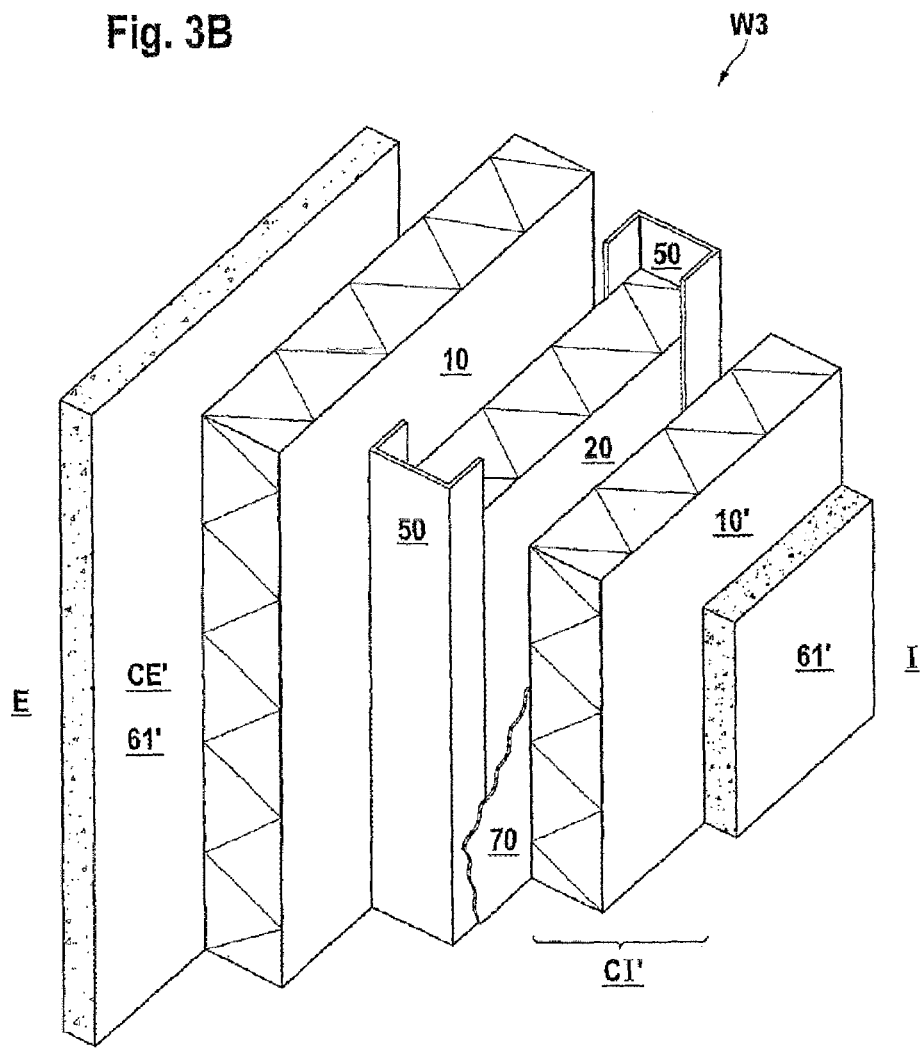

WALL STRUCTURE FOR A BUILDING

CROSS REFERENCE TO RELATED APPLICATION

The present application is a 35 U.S.C. §371 National Phase conversion of PCT/CH2009/000257, filed Jul. 17, 2009, the disclosure of which is incorporated herein by reference. The PCT International Application was published in the German language.

BACKGROUND OF THE INVENTION

The present invention relates to the technical area of building construction and, in particular, to a wall structure for a building as claimed, a prefabricated structural element having said structure and a building having structural elements prefabricated in this manner.

A building structure with a foam material base and a timber-frame support structure erected thereon has already been made known by patent NL 8902670. Said building structure is covered by front panels made of a foam material which are reinforced by a metal wire grille that is partly embedded therein.

International patent application WO 2005/121469 shows a building component made of a foam material, into which a three-dimensionally structured reinforcement lattice is embedded in an at least partial manner. The lattice parts standing out from the foam material are utilized for anchoring a layer of plaster.

SUMMARY OF THE INVENTION

It is the object of the present invention to improve the known wall structures, in particular to increase the loading capacity, the thermal insulation, sound insulation and radiation insulation thereof, at the same time to provide a simple structural design and the possibility to produce it in an easier and more cost-efficient manner.

This object is achieved by a wall structure for buildings which has a first plate-shaped support body made of a solid foam material, the surface of which to be oriented towards the interior of the building adjoins an insulating layer, and a first wave-shaped metal wire grille which is foamed at least partially into a surface of the first support body to be oriented towards the exterior of the building, as well as first fastening elements which penetrate both the first grille and the first support body in order to fasten support elements, between which the insulating layer is accommodated.

An essential point of the structure as claimed in the invention is, first of all, that the usually required loading capacity thereof is ensured just by the first support body in conjunction with the first metal wire grille that is embedded therein at least in a partial manner. In this case, the first wave-shaped grille acts in a stabilizing manner such that stresses, which are generated by static or dynamic loads acting on the support body, are distributed uniformly beyond said support body. Consequently, the structure as claimed in the invention also proves to be particularly earthquake-resistant, but also resistant to the effect of lateral force. In addition, the first grille keeps radiation away from the interior of the building, such as, for example, as emanate from high-voltage lines, telecommunications systems and radioactive sources, among other things. At the same time, the first grill serves to hold the fastening elements securely in their position so that they do not slip and sturdy accommodation for the insulating layer is ensured. The support body can consist of a polyurethane foam with a gravel insert, which has a high level of pressure resistance, capillary water absorption, unidirectional stability and good permeability to water vapor. In addition, the good level of thermal conductivity of the first grille prevents a wall that is structured in this manner from heating up easily, as the received heat is removed by means of the grille. Consequently, in conjunction with the insulating layer, particularly good thermal and sound insulation is generated, e.g. against a connection from a hot and also loud environment. In addition, the described wall structure can be produced in a particularly simple and cost-efficient manner, for example by placing the fastening elements at any desired position on the support body in a fully automated manner, not dependent, for example, on predefined bore holes.

Preferred further developments of the wall structure as claimed in the invention are specified in the subclaims. These relate, in particular, to insulation and stability aspects as well as to equipment details.

In an advantageous embodiment it is provided that the structure has an interior cover, which adjoins a surface of the insulating layer to be oriented towards the interior of the building, and second fastening elements, which penetrate the interior cover in order to fasten said interior cover to the support elements. Consequently, the support elements can not only be utilized for accommodating the insulating layer, but also for fastening the interior cover, and consequently they form a uniform fastening system. At the same time, the interior cover provides a further insulating layer. Consequently, a wall structure can be supplied with an already pre-mounted interior cover such that assembly on site in this respect is no longer required. In the simplest case, the interior cover can include gypsum plaster boards, which are provided subsequently with an individual coating (wallpaper or paint, among other things).

However, it is preferred when the interior cover includes a second plate-shaped support body made of a solid foam material, which is arranged adjoining the insulating layer. This means that the loading capacity of the wall structure is increased in a considerable manner, as is the thermal and sound insulation. In a preferred manner, the interior cover includes a second wave-shaped metal wire grille which is foamed at least partially into a surface of the second support body to be oriented towards the interior of the building. This means that the advantages which have already been mentioned in conjunction with the first metal wire grille are reinforced. In particular, the second grille also prevents the wall heating up, such that there is a good level of thermal insulation against a cold environment. In this case, it is conceivable to repeat the layering of the wall structure as claimed in the invention in an arbitrary manner depending on the requirements, i.e. to have another insulating layer following the second support body (with a second grille) and a third support body (with a third grille) following said insulating layer etc.

Such an interior cover preferably has an interior plaster layer which is applied on the surface of the second support body to be oriented towards the interior of the building and is anchored on the second metal wire grille. Consequently, a particularly secure hold of the interior plaster layer to the second support body is ensured by means of the second grille. In addition, a formation of cracks in the plaster is excluded in a reliable manner as a result of the particularly good stress distribution of loads introduced into the second support body.

When attaching an interior cover, it is additionally preferred to attach a vapor permeable film which extends between the insulating layer and the interior cover. This means that condensation water, which inevitably forms in the insulating layer when the temperature changes, is able to escape from this space.

This means that penetration of moisture through the wall from the inside is excluded.

In a similar manner to the interior cover, it is also possible to provide an exterior cover, which adjoins a surface of the first support layer to be oriented towards the exterior of the building and includes an exterior plaster layer, which is anchored on the first metal wire grille. In this case, such an exterior plaster layer entirely covers the first wave-shaped metal wire grille and also prevents the wall structure heating up. In addition, the exterior plaster acts so as to repel moisture and is also frost and shock resistant. However, in principle, it is also possible for the exterior cover to consist of a layer of mortar which covers the first grille and which, in its turn, bears decorative panels.

Wall structures which are exposed to the highest loads preferably have a respective three-dimensional metal wire grille which is foamed entirely into the first and/or second support body. This means that the loading capacity of the wall structure is clearly increased yet again. In a preferred manner, the insulating layer consists of a mineral wool material which provides the simplest and most effective thermal and sound insulation, which, in addition, is also cost-efficient.

A fastening of the support elements, which is particularly easy to mount and is holdable, is produced when the first and/or second fastening elements consist of a respective screw and abutment combination. In the simplest case, the abutment can consist of a threaded nut which is tightened against part of the support element and thus holds the element in position. However, it is also conceivable to have plate-shaped or block-shaped bearings which have threaded holes provided therein allowing for as large a fixing surface as possible.

Even simpler to mount, however, is a respective screw and abutment combination which includes a self-tapping screw and an abutment made of a plastics material. In this case, precise alignment of the two parts with respect to each other is not necessary, in particular when the abutment is developed in the shape of a plate or block.

In order to achieve particularly sturdy fastening of the support elements, the head diameter of a respective screw is preferably greater than the mesh width of the first or second metal wire grille. On the one hand, the screw can consequently be tightened against the grille and at the same time can be held in the meshes thereof.

In principle, a washer, the diameter of which is greater than the mesh width of the first or second metal wire grille, is provided for a respective screw. This means that one and the same screw can be used in metal wire grilles with variously large mesh widths when only the washer is adapted in a corresponding manner.

In order to exclude the screw and abutment combination acting as a heat or cold bridge, the screw can be produced from a material that is only a poor thermal conductor. However, in order to be able to use particularly heavy duty screws produced from a metal material, the head of a respective screw is preferably coverable by a plastics material cap and/or the washer consists of a plastics material. This means that the screw head is totally encapsulated in relation to its direct environment and is consequently thermally insulated.

In principle, it is also possible for the support element itself to be realized from a timber or plastics material, as a result of which a screw screwed therein—self tapping—would also be thermally insulated on the side of its abutment. However, if the support element consists of a metal material, it is preferred when a respective support element and abutment combination is formed and dimensioned such that a screw screwed into the abutment does not contact the support element.

In this case, a particularly simple mounting of the support element and abutment combination is provided when said combination is formed and dimensioned such that when the screw is screwed-in, a movement of the abutment in relation to the support element is blocked. Consequently, the abutment is accommodated with a precise fit by the support element, which makes further connecting elements or materials between the two superfluous.

To this end, a respective support element preferably has a substantially U-shaped cross sectional form, the legs of which are provided with through-openings for the accommodation of the fastening elements. The advantage of a support element formed in this manner is that the base thereof is able to serve as a stop member for a correspondingly formed abutment.

Irrespective of the form of the support elements, they can preferably be utilized to accommodate electric lines in the wall structure, said electric lines extending in the insulating layer and being held by the support elements.

In a further preferred embodiment, the wall structure as claimed in the invention is provided with heating and/or cooling hoses, which are laid in the interior and/or exterior cover and extend substantially between the wave crests of the first and/or second metal wire grille, which project beyond the respective surface of the first and/or second support body. This means that, on the one hand, the hoses are guided between the wave crests and are able to be laid in a simple manner. At the same time, the hoses can also be fastened easily to the first or second grilles, for example by means of cable connectors that are known per se.

Even simpler fastening is created when the heating and/or cooling hoses are held between a respectively additional flat metal wire grille, which extends beyond the wave crests of the first and/or second metal wire grille, and the first and/or second wave-shaped metal wire grille. Consequently, the hoses are covered in a planar manner and are fixed between the wave crests of the first or second grille, which is simpler to accomplish.

As an alternative to this, it is possible to hold the heating and/or cooling hoses in a respectively additional three-dimensional metal wire grille, which extends beyond the wave crests of the first and/or second metal wire grilles. Both the first or second and the additional grille are accommodated, for example, in a layer of plaster or mortar which, as a result, gains in stability or loading capacity. In this case, the hoses can already be laid in the additional grille before said grille is attached. This means that the mounting of the heating and/or cooling hoses is clearly made easier and is accelerated.

A particularly good loading capacity, insulating effect and radio-protection of the first and second metal wire grille is obtained when the mesh width thereof is between 5 mm and 30 mm and is preferably approximately 10 mm.

In a preferred manner, prefabricated structural elements for a building, in particular wall, floor or ceiling elements, are to have the wall structure as claimed in the invention. These elements can be configured corresponding to the afore-described embodiments such that further assembly operations on site are superfluous. This means that it is possible to erect buildings in a particularly rapid manner in various variants according to the customers' wishes.

Buildings with these prefabricated structural elements are preferably developed such that the structural elements are arranged and connected together such that the first and/or second metal wire grilles thereof form a Faraday cage. This means that ideal radiation protection is ensured with respect to the building exterior, for example against telecommunications radiation, high-voltage fields and radioactive radiation, among other things.

BRIEF DESCRIPTION OF THE DRAWINGS

Exemplary embodiments of the invention are explained in a detailed manner below with reference to the accompanying figures. Dimensional specifications in the drawings provide measurements in millimeters (mm). Identical or equally acting parts are provided with identical reference numerals in the figures, in which:

FIG. 1 shows a cross sectional view of a first wall structure as claimed in the invention to clarify the basic design thereof;

FIG. 2A shows a cross sectional view of a second wall structure as claimed in the invention, with an interior cover;

FIG. 2B shows a three-dimensional representation of the wall structure of FIG. 2A;

FIG. 3B shows a three-dimensional representation of the wall structure of FIG. 3A;

DESCRIPTION OF PREFERRED EMBODIMENTS

Figure 3A:
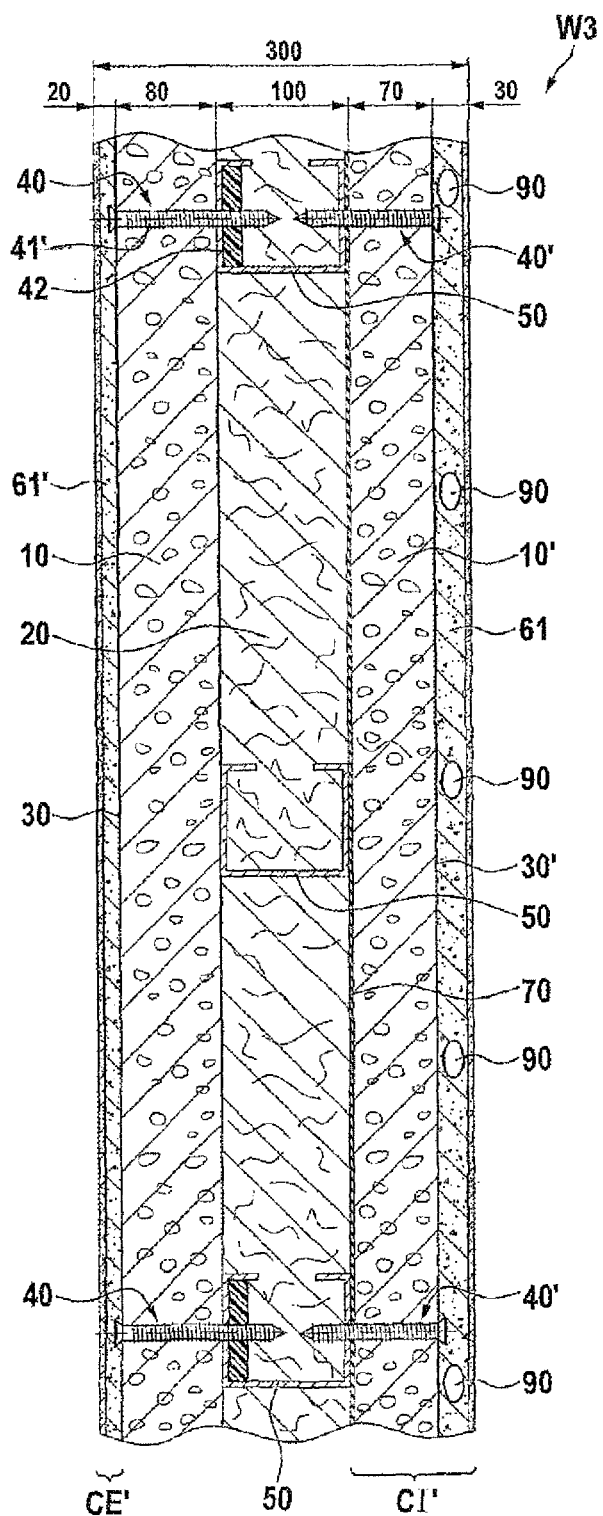
FIG. 3A shows a cross sectional view of a third wall structure as claimed in the invention, with an interior cover.

FIG. 1 shows a cross sectional view of a first wall structure W1 (wall 1) as claimed in the invention to clarify the basic design thereof. In this case, a basic structure includes a first support body 10 made of a polyurethane foam with a gravel insert, an insulating layer 20 made of mineral wool abutting against the surface of said first support body which is directed towards the interior I (interior) of the building. A first wave-shaped metal wire grille 30 is foamed into the surface of the first support body 10, which is directed towards the exterior E (exterior) of the building, such that the wave crests of said first metal wire grille stand out from the first support body. First support body 10 and first wave-shaped grille 30 provide bearing elements of the structure W1. Fastening elements 40 extend through the support body 10, said fastening elements substantially holding U-shaped support elements 50 made of steel, between which the insulating layer 20 is accommodated and consequently held on the support body 10. A fastening element 40, which consists of a (set) screw and abutment combination 41, 42, is shown here as an example. In this case, the abutment 42 includes a nut 42-1, which is tightened against a plastics material bush 42-2 which, in its turn, is accommodated in a positive locking manner in the U-shaped support element 50. This means that insulation of the fastening element 40 is achieved, preventing thermal transfer between support element 50 and screw 41 (or vice versa). In order to increase the insulation effect of the screw and abutment combination 41, 42 even more, the screw 41 consists additionally of a plastics material that is a poor thermal conductor but nevertheless has adequate tensile strength. Towards the exterior of the building, the screw head thereof is also provided with a covering 44 and a washer 43 made of plastics material in order to obtain the insulating effect there too. In this case, the washer 43 has a diameter that is greater than the mesh width of the first grille 30 such that the grille reacts to the tightening force of the screw 41 and at the same time holds it in position. The surface of the first support body 10 directed towards the exterior of the building is provided with an exterior cover CE, which includes various layers of mortar and a brick facing (not shown in any more detail).

In this case, the first wave-shaped metal wire grille 30 engages in the exterior cover CE and holds it such that the loading capacity thereof is increased in a considerable manner. At the same time, it serves to reinforce the support body 10 and to distribute stresses over the surface area of said body 10. This leads, on the one hand, to clearly increased loading capacity of the wall structure W1 and, on the other hand, prevents cracks forming in support body 10 and exterior cover CE. This means that the wall structure W1 is particularly resistant to static and dynamic loads, both in the vertical and horizontal direction. In addition, the first grille 30 acts as thermal insulation as it diverts heat and thus prevents the structure W1 heating up. In addition, it provides effective protection against all types of electro-magnetic fields. In addition, the structural exclusion of a heat bridge at the fastening element 40 in conjunction with the first support body 10 made of foam material and the insulating layer 20 made of mineral wool provides for optimum thermal and sound insulation of the structure W1. The support body 10 can also be provided with an additional three-dimensional metal wire grille, which is foamed therein and increases the loading capacity thereof even more.

FIG. 2A shows a cross sectional view of a second wall structure W2 as claimed in the invention with an interior cover CI, which proceeds from the basic design of the wall structure W1 already shown in FIG. 1. The interior cover CI consists, as an example, of gypsum plaster boards 60, which entirely cover the insulating layer 20 and are connected to the U-shaped support elements 50 by means of fastening elements (not shown here). The support elements 50 consequently serve for accommodating the insulating layer 20 and holding the interior cover 60. In contrast to the wall structure W1 of FIG. 1, the support elements 50 are held by fastening elements 40' which consist of a screw and abutment combination 41', 42'. The screw 41', in this case, is provided with a self-tapping thread, which is screwed into the abutment 42' made of a plastics material or even a timber material. The abutment 42' is accommodated in a leg of the U-shaped support element 50 in a positive locking manner, and is consequently blocked against rotation, said leg, for this purpose, once again engaging around the upper side of the abutment 42'. All in all, such a design of the fastening elements 40' allows for assembly of the wall structure W2 in a particularly simple and fully-automated manner. In this case, a vapor permeable film 70 made from a PVC material is attached between interior cover CI and insulating layer 20 in order to ensure ventilation of the inner insulating layer 20 whilst at the same time preventing the passage of liquid. As the interior cover CI can already be pre-assembled, it is no longer necessary to attach it on site. In addition, customers' wishes are able to be accommodated at a very early stage of the preparation of the building. The exterior cover CE of the wall structure W2 shown here is, in principle, not to be any different to that in FIG. 1. All in all, consequently, the structure W2 is particularly loadable without having to miss out on the other advantages already depicted with reference to FIG. 1. Over and above this, electric lines 80, which extend in the insulating layer 20 and are held in the U-shaped support elements 50, are also laid in the wall structure W2. Consequently, electric cabling can also be pre-assembled in the wall structure, only just having to be connected on site.

FIG. 2B shows a three-dimensional representation of the wall structure of FIG. 2A. The first support body 10, adjoined by the insulating layer 20, can be seen between the interior and exterior cover CI and CE of the structure W2. The three-dimensional design of the support elements 50 shows that they are realized as elongated U-shaped plates. In the section of the structure W2 that is shown, the openings of the support elements 50 face each other such that the insulating layer 20 is held between them. A PVC film 70, which is permeable to gases and water vapors and resists the passage of water in liquid form, extends between the interior cover CI and the insulating layer 20. For reasons of clarity, the fastening elements 40 and the first wave-shaped metal wire grille 30 that is embedded in the first support body 10 are not shown. The three-dimensional representation of the structure W2 illustrates the simple and compact design of the building wall as claimed in the invention, which is extremely capable of bearing and sturdy and, at the same time, is impermeable to radiation as well as insulating against heat and sound. A corresponding wall, ready-made according to requirements, is also able to be manufactured in a fully automated manner and used to build on site.

FIG. 3A shows a cross sectional view of a third wall structure W3 as claimed in the invention with an interior cover CI'. In this case, the structure W3 proceeds from the basic design of the wall structure W2 already described in FIG. 2. Here too, the support elements 50 are held by means of fastening elements 40, which include a self-tapping screw 41', which is screwed into an abutment 42' made of a plastics material or even a timber material. In this case, the exterior cover CE' of the structure W3 has an exterior plaster layer 61', which is anchored on the first wave-shaped metal wire grille 30. In addition, the structure W3 differs by its interior cover CI', which includes a second support body 10' and an interior plaster layer 61', in which heating and/or cooling hoses 90 are laid for heating or cooling the interior I of the building. In a mirror-inverted manner with respect to the first support body 10, the second support body 10' is provided with a second wave-shaped metal wire grille 30', which is also embedded at least partly in said second support body. Equally in a mirror-inverted manner with respect to the first support body 10, the second support body 10' is fastened on the support elements 50 by means of fastening elements 40' with self-tapping screws. In this case, as in the case of the first support body 10, the second wave-shaped grille 30' fulfils the task, on the one hand, of stabilizing the fastening elements 40', i.e. of supporting them and holding them in position. On the other hand, however, it serves here additionally to guide and fasten the heating and/or cooling hoses 90 between the wave crests of the protruding grille 30'. Consequently, it is possible to lay said hoses 90 on the second support body in a particularly simple manner before the interior plaster 61 is applied. In principle, it is naturally possible, in addition or as an alternative, to attach heating and/or cooling hoses in the exterior plaster 61' in a similar manner per se. Once again, a vapor permeable film 70 is mounted between interior cover CI' and insulating layer 20. Here too, it is naturally also possible to lay electric lines in the insulating layer 20, which is not shown here, however, for reasons of clarity. As a result of the interior cover CI' with the second support body 10', the wall structure W3 shown has increased loading capacity and stability, which, in principle, however, could be increased even more by foaming three-dimensional metal wire grilles into the support bodies 10, 10'. At the same time, the heat and sound insulation of the structure W3 is increased and increased protection against radiation is achieved by doubling the wave-shaped grilles 30, 30'.

FIG. 3B shows a three-dimensional representation of the wall structure W3 in FIG. 3A. Once again, this shows the basic design of the structure as claimed in the invention, which is accommodated between the exterior and interior cover CE', CI'. In this case, the interior cover CI' includes the second support body 10' and an interior plaster layer 61. The vapor permeable film 70 is mounted between interior cover CI' and insulating layer 20. The three-dimensional representation of the structure W3 also illustrates the simple and compact design of a building wall as claimed in the invention, which is extremely capable of bearing and sturdy and, at the same time, is impermeable to radiation as well as insulating against heat and sound. A wall of this type, ready-made according to requirements, is able to be manufactured in a fully automated manner and can be used to build on site.

Figure 4A:
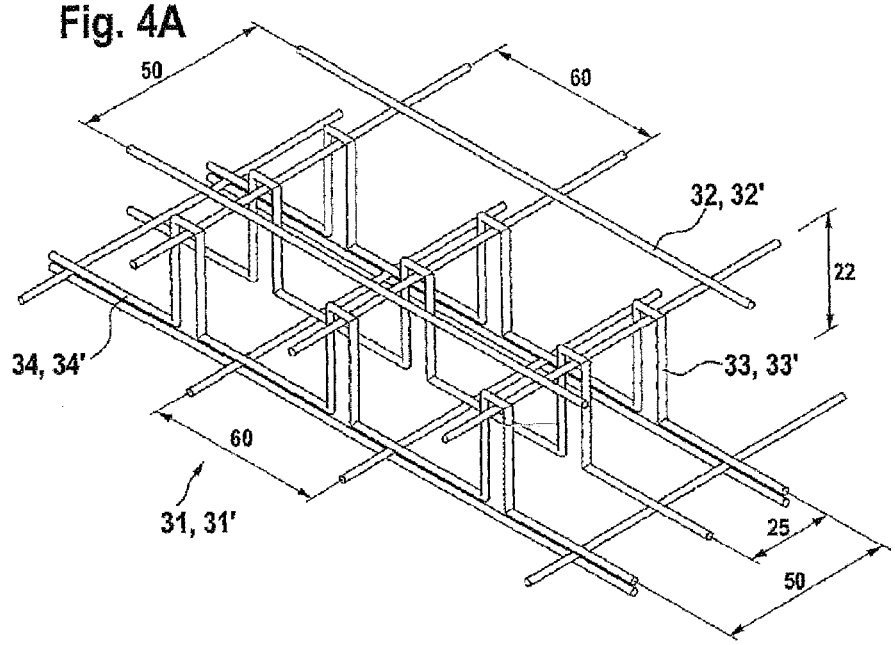
FIG. 4A shows a three-dimensional representation of an additional three-dimensional metal wire grille for accommodating heating and/or cooling hoses.

FIG. 4A shows a three-dimensional representation of an additional three-dimensional metal wire grille 31, 31' for accommodating heating and/or cooling hoses 90. The grille 31, 31' consists of two flat grilles 32, 32' and 34, 34', between which a three-dimensional wave-shaped grille 33, 33' is mounted. The resultant extremely sturdy structure can be embedded into an interior and/or exterior cover CI', CE' of the wall structure as claimed in the invention and can serve for the additional stabilization thereof. In particular, however, heating and/or cooling hoses can be accommodated in the channels of the grilles 31, 31', as early as prior to mounting the grille 31, 31' in the covers CI', CE'. Consequently, it is possible to lay the hoses in a particularly simple manner.

Figure 4B:
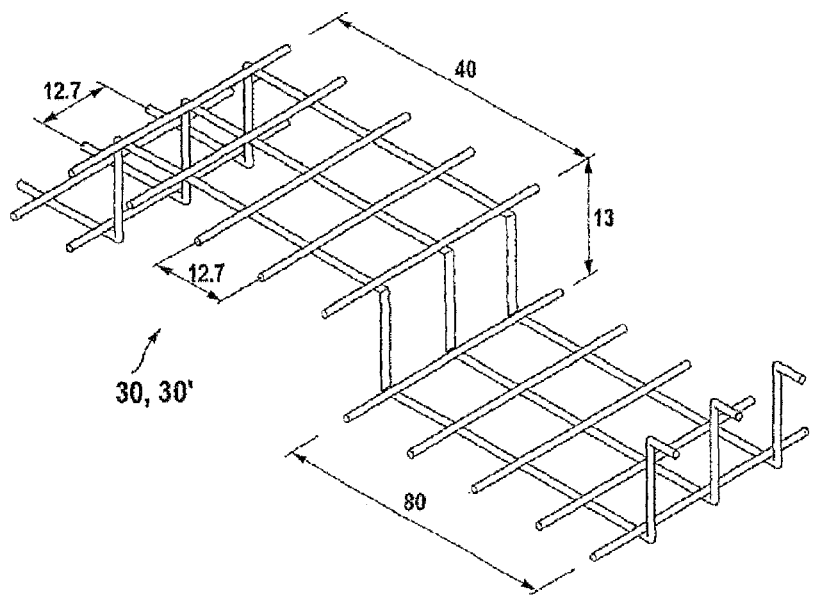
FIG. 4B shows a three-dimensional representation of a first or second wave-shaped metal wire grille for embedding in first or second support bodies.

FIG. 4B shows a three-dimensional representation of a first or second wave-shaped metal wire grille 30, 30' for embedding into first or second support bodies 10, 10'. In this case, the wave valley of the grilles 30, 30' is foamed into the surface of the support bodies 10, 10', whilst the wave crests stand out therefrom and engage in a layer of plaster or mortar that is to be applied. The mesh width of the grilles in this case is 12.7 mm.

Figures 5A, 5B:
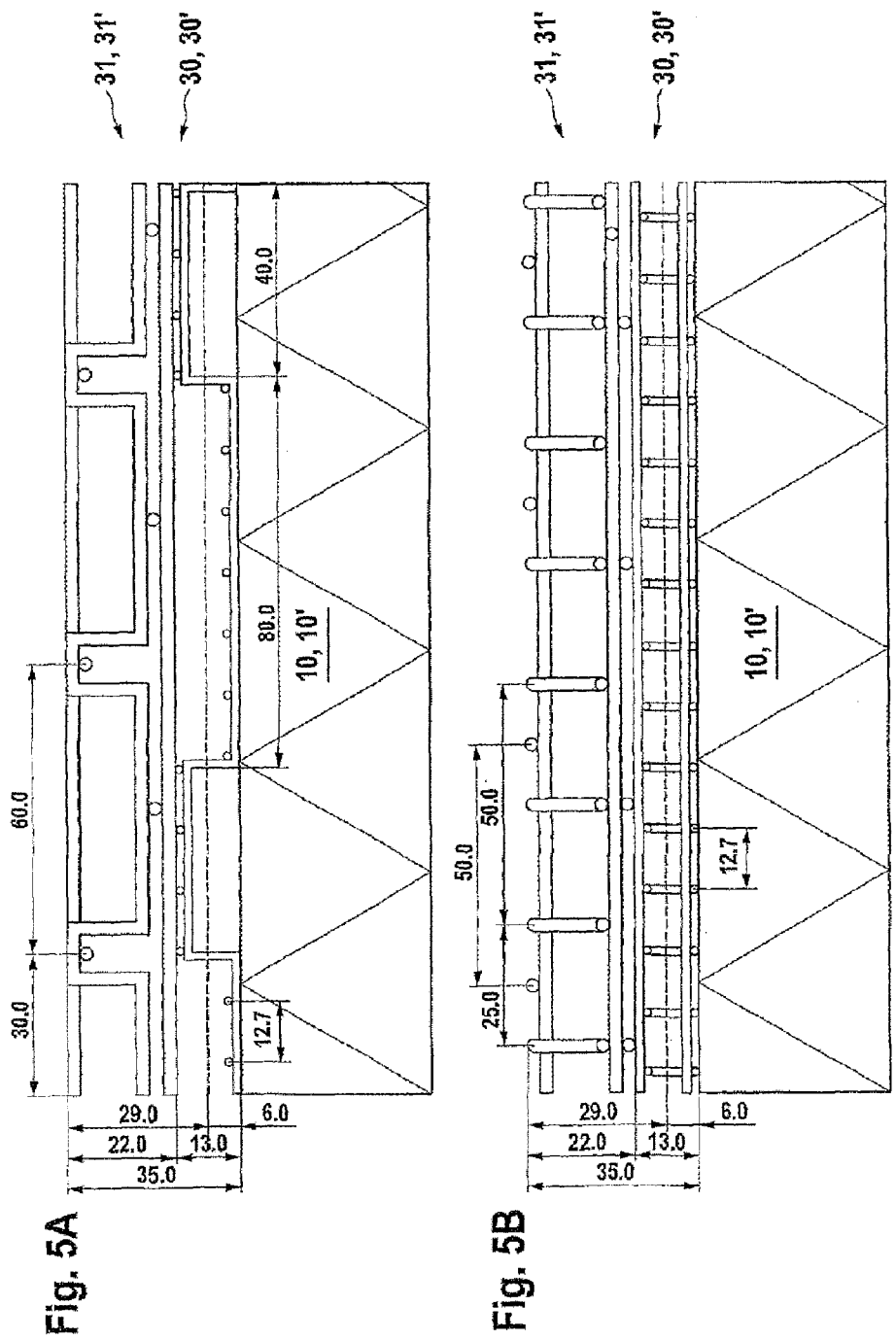
FIG. 5A shows a side view of a first or second support body with the grilles of FIG. 4.
FIG. 5B shows a front view of the first or second support body as shown in FIG. 5A

FIG. 5A shows a side view of a first or second support body 10, 10' with the grilles 30, 30' and 31, 31' of FIG. 4. The grilles 30, 30' are foamed into the support bodies 10, 10' at a depth of 6 mm and are connected to the three-dimensional grilles 31, 31' at the surface thereof. Heating and/or cooling hoses can be laid in the channels of the grille 31, 31' before the grilles 31, 31' are embedded into a cover. Where the grilles 30, 30' are dimensioned in a suitable manner, it is also conceivable, however, to lay the hoses between the wave crests of the grilles 30, 30' and to hold them by means of the grilles 31, 31', which are guided beyond the wave crests.

FIG. 5B shows a front view of the first or second support body 10, 10' of FIG. 5A. In this case, it can be seen that the heating and/or cooling hoses can also be laid in a direction that extends perpendicular with respect to the channels of FIG. 5A, such that the hoses are held well throughout in all directions.

Figure 6:
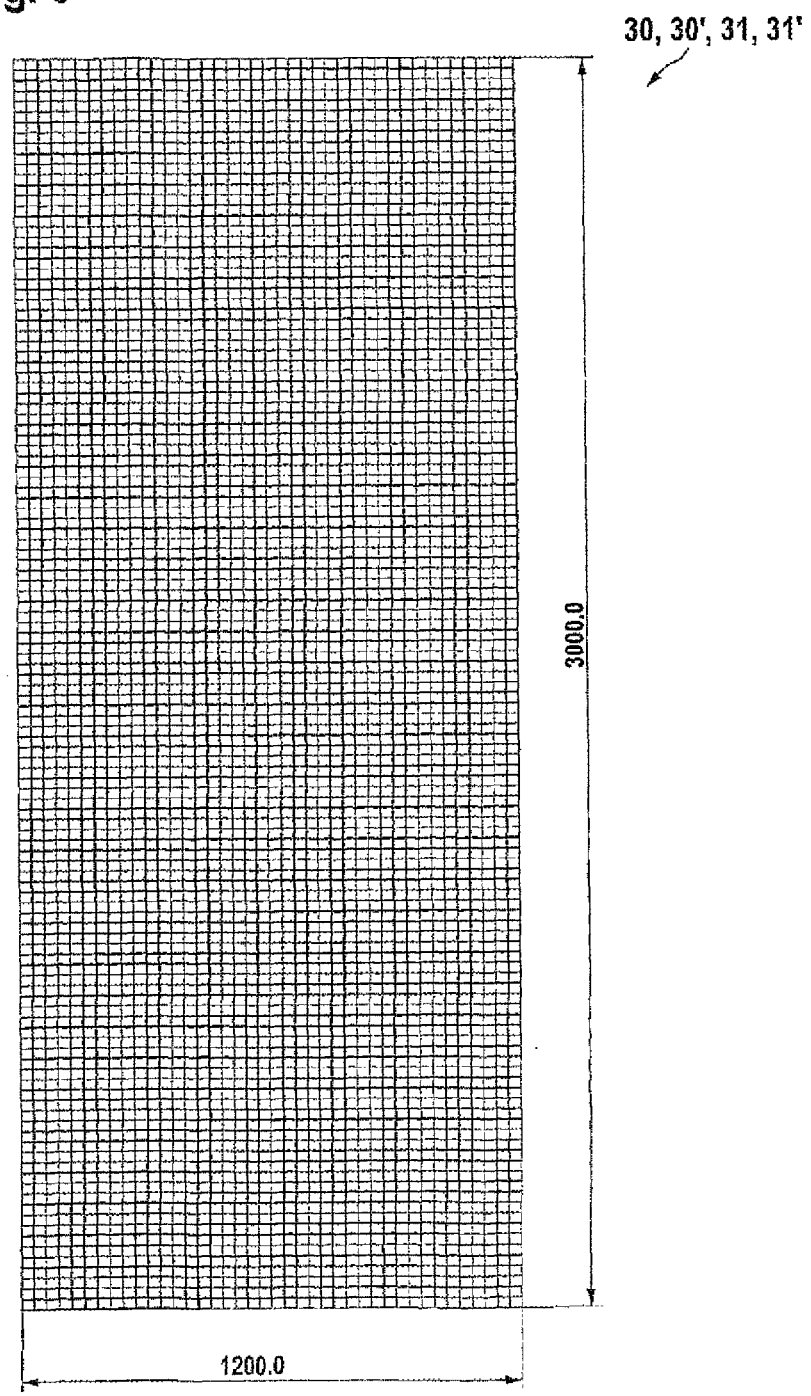
FIG. 6 shows a top view of the grilles of FIG. 5.

FIG. 6 shows a top view of the grilles 30, 30' and 31, 31' of FIG. 5, from which the identical mesh width throughout the common grille structure can be seen. Throughout this only requires one identical fastening element, which penetrates the grilles 30, 30' (or additionally the grilles 31, 31') and the support bodies 10, 10' in order to fasten the support elements on the support body 10, 10'. The figure also illustrates that such a grille structure is particularly well suited to act comparably in a stabilizing and thermally conducting manner and to block unwanted electro-magnetic radiation. In particular, wall elements with the structure as claimed in the invention are able to be connected together such that a Faraday cage is created, protecting a building interior from radiation and lightning strike, among other things.

In principle, to improve the efficiency of the wall structure as claimed in the invention in a further manner, it is naturally conceivable to undertake multiple layering of the basic design thereof, that is to say linking multiple support bodies together with metal wire grilles as well as insulating layers, which are connected together, in each case, by means of fastening elements. Corresponding layerings are dependent on the specific requirements for a wall structure for buildings and are at the discretion of the expert.

What is claimed is:

1. A wall structure for a building, said wall structure having a first plate-shaped support body made of a solid foam material, having an interior surface which is to be oriented towards the interior (I) of the building, said interior surface adjoins an insulating layer, a first wave-shaped metal wire grille with wave valleys and wave crests and having a mesh width between 5 mm and 30 mm is at least partially embedded with said wave valleys in an exterior surface of the first support body which is to be oriented towards the exterior (E) of the building, first fastening elements which penetrate both the first wave-shaped metal wire grille and the first support body in order to fasten support elements, between which the insulating layer is accommodated, and an exterior plaster layer covering the first wave-shaped metal wire grille standing out of the exterior surface of the support body.

2. The structure as claimed in claim 1, having an interior cover (CI), which adjoins a surface of the insulating layer to be oriented towards the interior (I) of the building, and having second fastening elements, which penetrate the interior cover (CI) in order to fasten said interior cover to the support elements.

3. The structure as claimed in claim 2, where the interior cover (CI) includes gypsum plaster boards.

4. The structure as claimed in claim 2, where the interior cover (CI) includes a second plate-shaped support body made of a solid foam material which is arranged adjoining the insulating layer.

5. The structure as claimed in claim 4, where the interior cover (CI) includes a second wave-shaped metal wire grille with wave valleys and wave crests and having a mesh width between 5 mm and 30 mm is at least partially embedded with the wave valleys in a surface of the second support body to be oriented towards the interior (I) of the building.

6. The structure as claimed in claim 5, where the interior cover (CI) has an interior plaster layer which is applied on the surface of the second support body to be oriented towards the interior (I) of the building and is anchored on the second metal wire grille.

7. The structure as claimed in claim 5, having heating or cooling hoses which are laid in the interior cover (CI) and extend substantially between the wave crests of the second wave-shaped metal wire grille, which project beyond the respective surface of the second support body.

8. The structure as claimed in claim 7, where the heating or cooling hoses are held between a respectively additional flat metal wire grille, which extends beyond the wave crests of the second wave-shaped metal wire grille, and the second wave-shaped metal wire grille.

9. The structure as claimed in claim 7, where the heating or cooling hoses are held in a respectively additional three-dimensional metal wire grille, which extends beyond the wave crests of the second wave-shaped metal wire grille.

10. The structure as claimed in claim 5, where the mesh width of the second metal wire grille is approximately 10 mm or 12.7 mm.

11. The structure as claimed in claim 2, having a vapor permeable film which extends between the insulating layer and the interior cover (CI).

12. The structure as claim 2, where the second fastening elements consist of a screw and abutment combination.

13. The structure as claimed in claim 1, having an exterior cover (CE) which adjoins a surface of the first support layer to be oriented towards the exterior (E) of the building, and which includes an exterior plaster layer which is anchored on the first metal wire grille.

14. The structure as claimed in claim 1, where the insulating layer consists of a mineral wool material.

15. The structure as claim 1, where the first fastening elements consist of a screw and abutment combination.

16. The structure as claimed in claim 15, where the screw and abutment combination includes a self-tapping screw and an abutment made of a plastics material.

17. The structure as claimed in claim 15, where the head diameter of the screw is greater than the mesh width of the first or second metal wire grille.

18. The structure as claimed in claim 15, where a washer, the diameter of which is greater than the mesh width of the first or second metal wire grille, is provided for the screw.

19. The structure as claimed in claim 18, where the washer consists of a plastics material.

20. The structure as claimed in claim 15, where the head of the screw is coverable by a plastics material cap.

21. The structure as claimed in claim 15, where a respective support element and abutment combination is formed and dimensioned such that the screw that is screwed-into the abutment does not contact the support element.

22. The structure as claimed in claim 15, where a respective support element and abutment combination is formed and dimensioned such that when the screw is screwed-in, a movement of the abutment in relation to the support element is blocked.

23. The structure as claimed in claim 1, where a respective support element has a substantially U-shaped cross sectional form, having legs which are provided with through-openings for the accommodation of the fastening elements.

24. The structure as claimed in claim 1, having electric lines which extend in the insulating layer and are held by the support elements.

25. The structure as claimed in claim 1, having heating or cooling hoses which are laid in the exterior cover (CE) and extend substantially between the wave crests of the first wave-shaped metal wire grille, which project beyond the respective surface of the first support body.

26. The structure as claimed in claim 25, where the heating or cooling hoses are held between a respectively additional flat metal wire grille, which extends beyond the wave crests of the first wave-shaped metal wire grille, and the first wave-shaped metal wire grille.

27. The structure as claimed in claim 25, where the heating or cooling hoses are held in a respectively additional three-dimensional metal wire grille, which extends beyond the wave crests of the first wave-shaped metal wire grilles.

28. The structure as claimed in claim 1, where the mesh width of the first wave-shaped metal wire grille is approximately 10 mm or 12.7 mm.

29. A prefabricated structural element for a building, in particular a wall, floor or ceiling element, having a wall structure as claimed in claim 1.

30. A building having prefabricated structural elements as claimed in claim 29, which are arranged and connected together such that the first wave-shaped metal wire grilles thereof forms a faraday cage.

31. A building having prefabricated structural elements as claimed in claim 29, which are arranged and connected together such that the second metal wire grille thereof forms a faraday cage.

32. The structure as claimed in claim 1, where the solid foam material is a polyurethane foam.

33. The structure as claimed in claim 1, where it comprises a three-dimensional wire grille connected to the first wave-shaped metal wire grille and embedded in the exterior plaster layer.

34. The structure as claimed in claim 33, where the three-dimensional wire grille comprises two flat metal wire grilles, between which a three-dimensional wave-shaped grille is mounted.

* * * * *